United States Patent [19]
McCullough et al.

[11] Patent Number: 6,014,315
[45] Date of Patent: Jan. 11, 2000

[54] HEAT SINK ASSEMBLY WITH MULTIPLE PRESSURE CAPABILITY

[75] Inventors: Kevin A. McCullough, No. Kingstown; William B. Rife, Greenville, both of R.I.

[73] Assignee: Chip Coolers, Inc., Warwick, R.I.

[21] Appl. No.: 09/149,315

[22] Filed: Sep. 8, 1998

[51] Int. Cl.⁷ ...................................................... H05K 7/20
[52] U.S. Cl. .......................... 361/704; 165/80.2; 174/16.3; 257/727; 361/710
[58] Field of Search .................................. 165/80.2, 185; 174/16.3; 257/706–707, 712–713, 718–719, 726–727; 361/704, 707, 709–710, 714–718, 722; 439/485, 487

[56] References Cited

U.S. PATENT DOCUMENTS

| | | | |
|---|---|---|---|
| Re. 35,573 | 7/1997 | Clemens | 257/719 |
| 2,916,159 | 12/1959 | O'Neill | 211/89 |
| 3,033,537 | 5/1962 | Brown, Jr. | 257/263 |
| 3,229,756 | 1/1966 | Keresztury | 165/67 |
| 4,345,267 | 8/1982 | Corman et al. | 357/81 |
| 4,591,896 | 5/1986 | Kikuchi | 257/727 |
| 4,607,685 | 8/1986 | Mitchell, Jr. | 165/80.3 |
| 4,660,123 | 4/1987 | Hermann | 361/386 |
| 4,745,456 | 5/1988 | Clemens | 357/79 |
| 5,109,317 | 4/1992 | Miyamoto et al. | 361/704 |
| 5,313,099 | 5/1994 | Tata et al. | 257/717 |
| 5,397,919 | 3/1995 | Tata et al. | 257/717 |
| 5,708,564 | 1/1998 | Lin | 361/704 |
| 5,784,257 | 7/1998 | Tata | 361/704 |

FOREIGN PATENT DOCUMENTS

| | | |
|---|---|---|
| 0130279A3 | 1/1987 | European Pat. Off. . |
| 295 16 627 U1 | 12/1995 | Germany . |
| 58-176959 | 10/1983 | Japan . |

*Primary Examiner*—Gregory Thompson
*Attorney, Agent, or Firm*—Barlow, Josephs & Holmes, Ltd.

[57] ABSTRACT

A heat dissipating device which can provide multiple levels of pressure to a semiconductor package, having an outer peripheral ceramic region and an inner silicon region, is provided. A top cover member is provided with a central female-threaded bore. The top member is secured to the ceramic portion of the semiconductor package via a number of fasteners. A heat dissipating member, having male-threaded base, is threadably inserted into the female-threaded bore to engage the upper surface of the silicon portion of the semiconductor package. The pressure of the heat dissipating member is independently adjustable relative to the attachment pressure of the top member onto the ceramic portion of the semiconductor package. As a result, the multiple pressure requirements of the semiconductor package can be accommodated in a single heat dissipating device.

14 Claims, 6 Drawing Sheets

HEAT SINK ASSEMBLY WITH MULTIPLE PRESSURE CAPABILITY

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board, also known as a motherboard. These integrated circuit devices, particularly the CPU microprocessor chips, generate a great deal of heat during operation which must be removed to prevent adverse effects on operation of the system into which the device is installed. For example, a PENTIUM microprocessor containing millions of transistors is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers. For example, many microprocessors manufactured by the Motorola Corporation, for use in Apple Corporation computers, employ BGA-type packages. Unlike a PENTIUM microprocessor with a PGA package, which has pins to be installed into a receiving socket, BGA and LGA semiconductor packages include an array of electrical contacts on their bottom surfaces to engage directly with an array of receiving electrical contacts on a circuit board, socket or the like. These semiconductor device packages have, in the past, been soldered directly to a circuit board or socket. However, such direct soldering makes replacement and/or upgrade of the semiconductor device package more difficult because it must be unsoldered from the board or socket for such replacement or upgrade.

To address the foregoing concerns, various sockets are being provided to receive, in temporary fashion, a BGA, LGA or similar surface mount semiconductor device package. In the event replacement or upgrade is required, the chip is simply removed from the socket and replaced with the new package. However, there are various concerns relating to the use of such BGA and LGA socket. For example, since no soldering is carried out in these new socket configurations, the solder balls of a BGA package and the contacts of an LGA must be maintained in electrical communication with the corresponding contact array on the socket. As a result, a minimum amount of pressure or force must be maintained on the semiconductor device package to maintain the electrical contact with the socket. It is not uncommon for the required minimum pressure to be in the vicinity of 50 psi (pounds per square inch) to maintain the electrical connection of the device package to the socket into which it is installed. If this pressure is not maintained, or is not consistent over the surface of the package, the electrical connection will fail.

Various efforts have been made to simply clamp the semiconductor device package, such as a BGA or LGA, to its corresponding socket by a top planar member with a series of screw fastening members sufficiently secured to attain the desired psi pressure on the package. However, BGA and LGA and similar packages commonly include a separate silicon portion containing the actual electronic components which is then subsequently mounted to a larger ceramic base. Since the silicon central pad is installed on the ceramic base, which contain the necessary interconnections for the package, the semiconductor device package is thicker at its central portion. Problems have arisen in connection with these BGA and LGA socket systems because at least 40 or 50 psi must be applied to the ceramic portion to maintain the socket interconnection; however, while the central silicon pad region would be crushed and/or damaged by such a force applied thereto. It is not uncommon for such a device package to have a minimum 50 psi requirement on the ceramic portion to maintain the electrical interconnection to the socket while having a maximum 10 psi requirement on the silicon portion to avoid damage thereto.

In similar fashion to the PENTIUM-type semiconductor devices discussed above, the BGA, LGA and related device packages also suffer from excessive generation of heat. If such heat is not properly dissipated, the chip will eventually fail. As a result, efforts have been made to supply a heat dissipating member, such as a heat sink, into thermal communication with the silicon portion of the semiconductor device package, such as a BGA or LGA chip. As a result of the competing needs for heat dissipation and pressure to maintain the socket connection, problems arise. In particular, simple clamping of a heat sink member to the top portion of a BGA socket must be maintained at a pressure sufficient to maintain the electrical interconnections to the socket; however, such a high pressure creates a risk of damage to the silicon portion of the package.

In view of the foregoing, there is a demand for a heat sink assembly which can simultaneously provide the requisite high pressure for maintaining a semiconductor device package in electrical interconnection with its corresponding socket while simultaneously providing a heat sink member in flush thermal communication with the silicon portion of a package at a second pressure much lower than the pressure being simultaneously applied to the ceramic portion of the semiconductor device package. In addition, there is a demand for a heat sink assembly that can independently adjust the pressure applied to the outer ceramic portion of a packet while permitting custom adjustment of the pressure of a heat sink applied to the silicon portion of the same semiconductor device package.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling microprocessor integrated circuit devices, such as a ball grid array (BGA) and land grid array (LGA) semiconductor device packages. The heat sink assembly of the present invention enables the simple, easy and inexpensive assembly, use and maintenance of a heat sink assembly while realizing superior heat dissipation.

The preferred embodiment of the heat dissipating device of the present invention includes a semiconductor socket where the socket defines a number of female-threaded fastener holes. A semiconductor package is installed in the socket where the semiconductor package has a lower surface with electrical contacts thereon. The electrical contacts are in electrical communication with the semiconductor socket and the semiconductor package includes an outer peripheral region defining a first thickness of the semiconductor package and a first upper surface and an inner pad region defining a second thickness of the semiconductor package, which is larger than said first thickness, and a second upper surface. A top cover member with a peripheral edge and a bottom surface is also provided where the top cover member defines a female threaded bore therethrough. The bottom surface of the top cover member is in communication with the first upper surface of the semiconductor package at the outer peripheral region and the top cover member including a number of fastener through-holes therethrough proximal to the peripheral edge.

In addition, a heat dissipating member is provided, with a threaded base portion with a substantially flat bottom surface adapted to be threadably received in the female threaded bore through the top cover member into communication with the second upper surface of the semiconductor package at the inner pad region; the heat dissipating member, and threaded routing into said threaded bore, defines an inner pad region pressure onto said second surface of the semiconductor package. A number of male-threaded fasteners are routed through the fastener through-holes of the top cover member and into communication with the female-threaded fastener holes of the semiconductor socket to maintain communication of the bottom of the top cover member with the first upper surface of the semiconductor package. The fasteners defines an outer peripheral region pressure to be imparted on the first upper surface of the semiconductor package by the bottom surface of the top cover member.

As a result, the outer peripheral region pressure and the inner pad region pressure are independently adjustable to enable different pressures to be applied to the first upper surface of the semiconductor package and the second upper surface of said semiconductor package, respectively.

In operation, the top plate of the present invention is placed over the socket or circuit board containing the receiving interconnection seat with the semiconductor device package disposed or sandwiched therebetween. A series of fasteners are routed through the top plate and engaged with either the device package socket or the circuit board itself, depending on the particular configuration at hand. The fasteners are engaged with the socket or circuit board in accordance with a predetermined pressure which is sufficient to maintain the device package and electrical interconnection with the array of interconnection seats. Typically, these interconnection seats are on a separate socket which is commonly installed directly to a circuit board substrate. The central heat dissipating member is then threaded into the central bore of the top member with engagement of the male threaded shank to the female threads about the bore. The heat dissipating member is then threaded into the bore a distance sufficient to impart a predetermined pressure, typically lower than the pressure required to maintain the package and electrical interconnection with the socket. As can be understood, the application to the outer peripheral ceramic of the packet can be applied separately and independently from the pressure applied to the central pad silicon portion of the package.

It is therefore an object of the present to provide a heat sink assembly which can accommodate a surface mount semiconductor device package.

Another object of the present invention is to provide a heat sink assembly with multiple pressure capability.

It is a further object of the present invention to provide a heat sink assembly which can provide a given pressure to the periphery of a semiconductor device package while simultaneously applying a relatively smaller pressure to the silicon portion of a semiconductor device package.

It is a further object of the present invention to provide a heat sink assembly which can provide independently adjustable pressure to the ceramic portion of a semiconductor device package in flush thermal communication at a second, lower pressure to the silicon portion of the package.

It is yet another object of the present invention to provide a heat sink assembly which can accommodate a wide array of surface mount semiconductor device packages which may be installed in a socket or directly to a circuit board.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
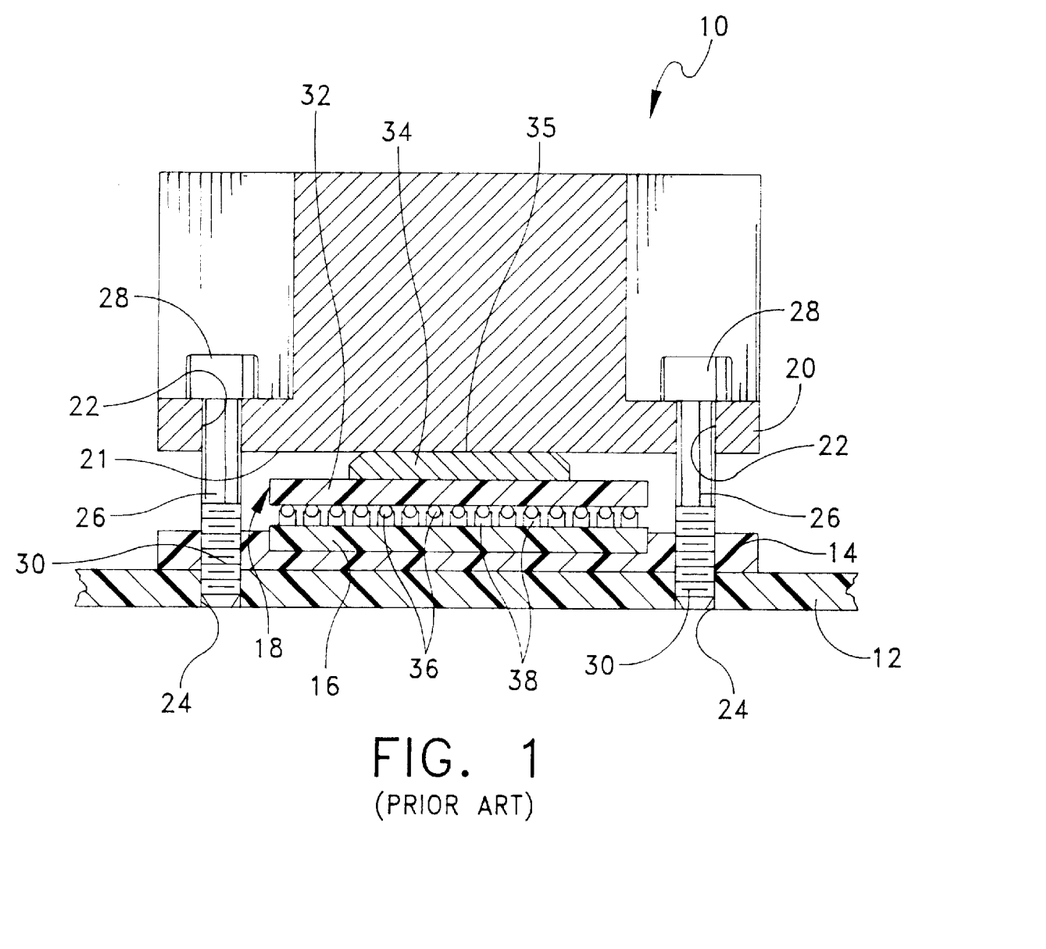
FIG. 1 is a cross-sectional view of a BGA heat sink assembly of the prior art.

Referring first to FIG. 1, a cross-sectional view of a heat sink assembly of the prior art is shown. In particular, prior art heat sink assembly 10 includes a circuit board 12 with socket carrier 14 installed thereon. Further, a BGA socket 16 is installed in the socket carrier 14 to provide an array of contacts 38. A heat dissipating member 20 is provided for heat sink capability and is positioned over BGA socket 16 with BGA semiconductor device 18 sandwiched therebetween.

In particular, BGA semiconductor device 18 includes BGA balls 36 disposed on BGA ball seats or contacts 38. Ceramic portion 32, containing electrical interconnections (not shown) to BGA balls 36 is provided with silicon central pad 34 disposed thereon. Upper surface 35 of silicon 34 is disposed in flush thermal communication with bottom surface 21 of heat dissipating member 20.

Male threaded fasteners 26 with head 28 and threads 30 are provided through apertures 22 and heat dissipating member 20 to be routed through socket carrier 14 and into threaded engagement with circuit board 12 via thread bores 24. As a result, BGA semiconductor device 18 is maintained in electrical connection to circuit board 12 via BGA balls 36 and contacts 38 while simultaneously being in contact with heat dissipating member 20 for heat sinking capabilities to dissipate heat generated by silicon portion 34. However, as described above, this prior art configuration shown in FIG. 1 results in equal pressure applied to both silicon portion 34 and BGA balls 36. With this configuration, only a single pressure can be applied which must be at a relatively high pressure to ensure that the electrical interconnection of BGA balls 36 to contacts 38 is made and maintained. However, this higher pressure places the critical silicon portion 34 at risk because the pressure applied thereto is greater than that desired to avoid damage thereto.

The foregoing prior art heat sink assembly 10 of FIG. 1 is merely an exemplary illustration of what is generally being practiced in the prior art. In particular, prior art FIG. 1 illustrates a BGA semiconductor device; however, an LGA or other surface mount package is similarly sandwiched in accordance with prior art FIG. 1. It should be understood that BGA balls 36 are not melted to permanently interconnect to contacts 38 thus requiring a continued pressure from some type of device or assembly. Similarly, LGA devices require a constant pressure to maintain the electrical interconnection to a socket into which it is installed. Further, prior art FIG. 1 illustrates use of a male threaded fastener 26 which is threadably engaged through socket carrier 14 and into circuit board 12. Various prior art configurations employ other methods to maintain the heat dissipating member 20 into communication with the silicon portion 34 at a given pressure such as by use of clips, or the like. Further, the retaining clips (not shown) or fasteners 26 may be routed directly to circuit board 12 or to BGA socket 16 alone, depending on the configuration and application at hand. Notwithstanding the differences in the particular configuration, the prior art attempts include the use of a single heat sink member which maintains a sandwich with the package socket with the semiconductor package itself disposed therebetween at a single pressure.

Figure 2:
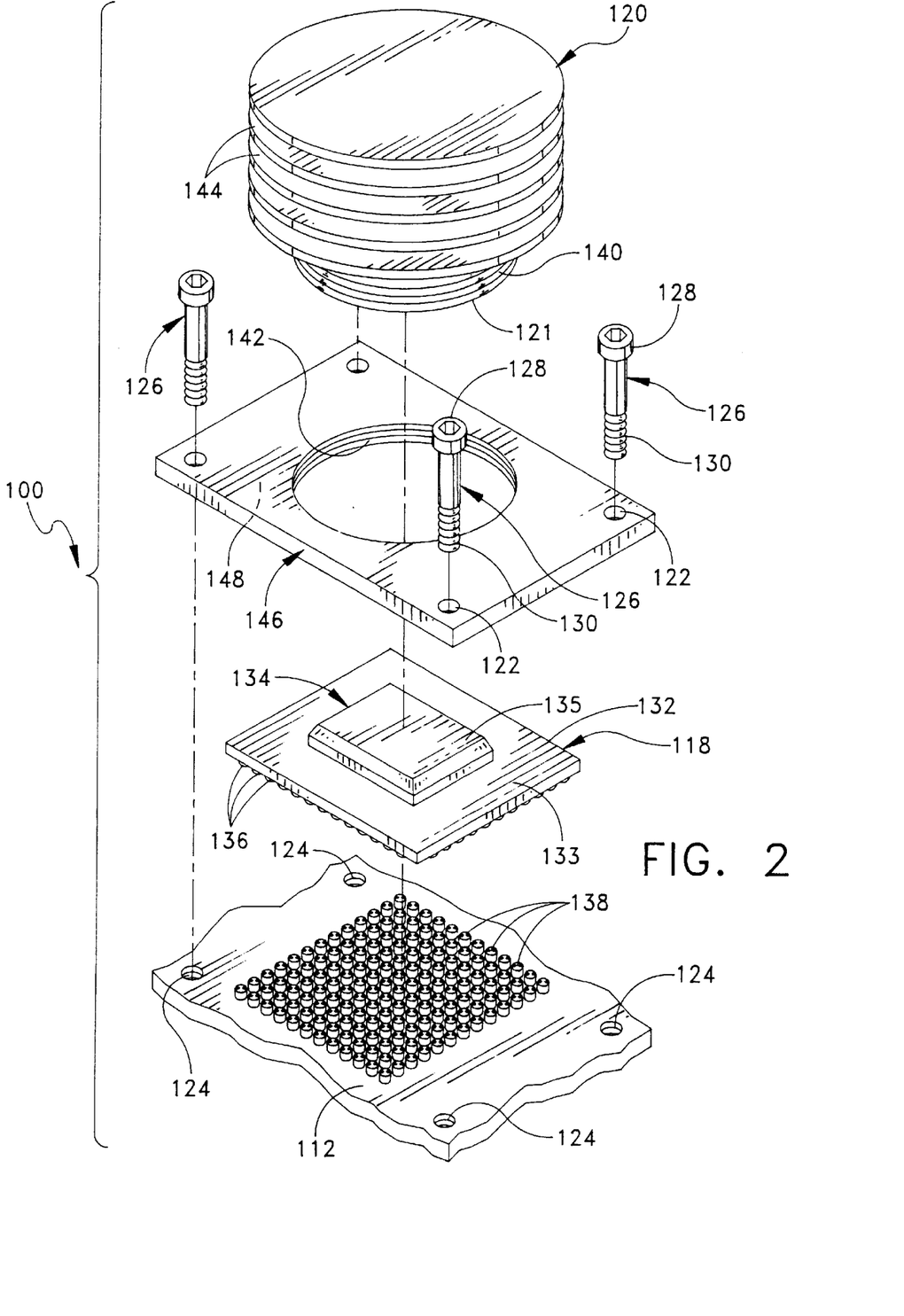
FIG. 2 is an exploded perspective view of the BGA heat sink assembly of the present invention.

Turning now to FIG. 2, the heat sink assembly 100 of the present invention is shown. It should be noted that FIGS. 2–8 of the present invention illustrate a heat sink assembly for a BGA-type semiconductor device package. It should be understood that various other types of surface mount semiconductor packages may be employed within and accommodated by the present invention. Further, various types of socket and contact arrays may be employed and still be within the scope of the present invention. For ease of illustration, the following description relates to employment of the present invention for a BGA semiconductor device package. However, other types of packages, such as LGA packages, may also be easily accommodated by the heat sink assembly of the present invention.

In FIG. 2, circuit board 112 includes an array of contacts 138 which serve as BGA ball seats for engagement with BGA balls 136 on the underside of BGA semiconductor device package 118. As a result, contact array 138 serves as a socket for BGA semiconductor device 118 and the non-soldered engagement of balls 136 thereto to maintain electrical interconnection between BGA device 118 and circuit board 112.

In particular, BGA device 118 includes a ceramic portion 132 containing internal interconnections (not shown) from silicon portion 134 to BGA balls 136. BGA device 118 provides a top surface 133 of ceramic 132 as well as a second top surface 135 of silicon 134.

Disposed above BGA device 118 is a top cover plate 146 which includes a substantially central female threaded aperture 142 as well as a number of holes 122 positioned about the periphery of top cover plate 146. Female threaded aperture 142 is large enough to receive silicon portion 134 therein when bottom surface 148 of top cover plate 146 is in communication with top surface 133 of ceramic 132. Fasteners 126, with heads 128 and threads 130, are routed through holes 122 into communication with threaded bores 124.

Figure 3:
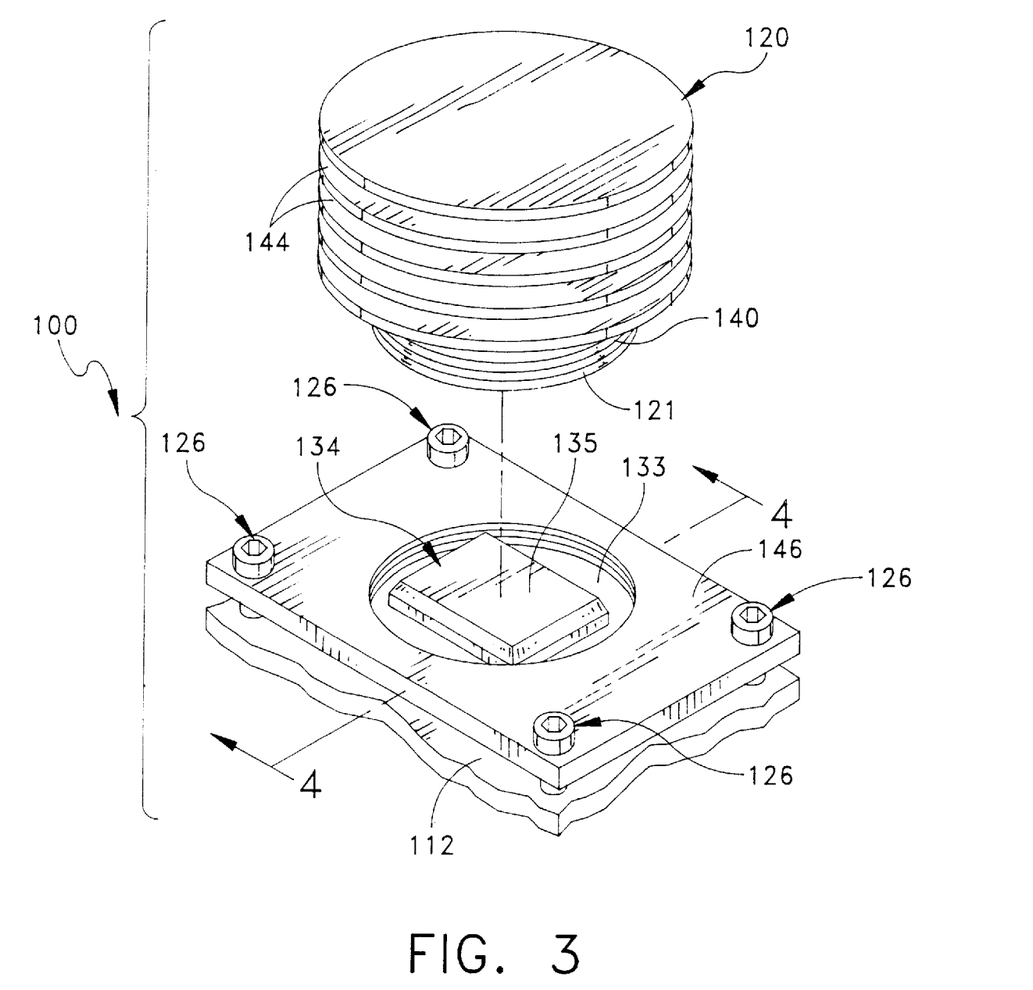
FIG. 3 is a partially assembled perspective view of the BGA heat sink assembly of the present invention shown in FIG. 2.
Figure 4:
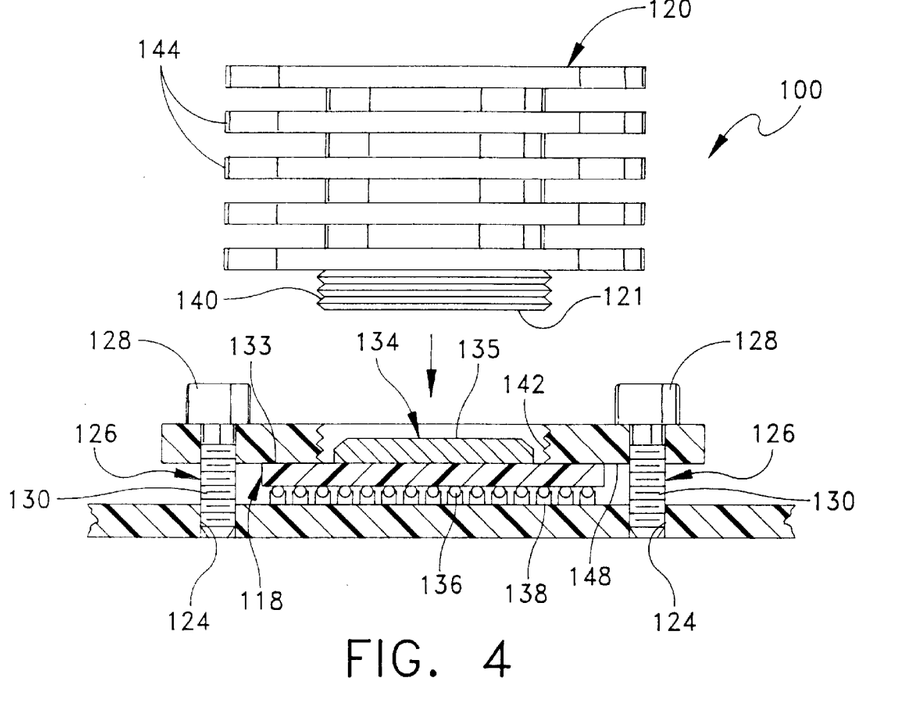
FIG. 4 is a cross-sectional view through the line 4—4 of FIG. 3 prior to installation of the threaded heat dissipating member.
Figure 5:
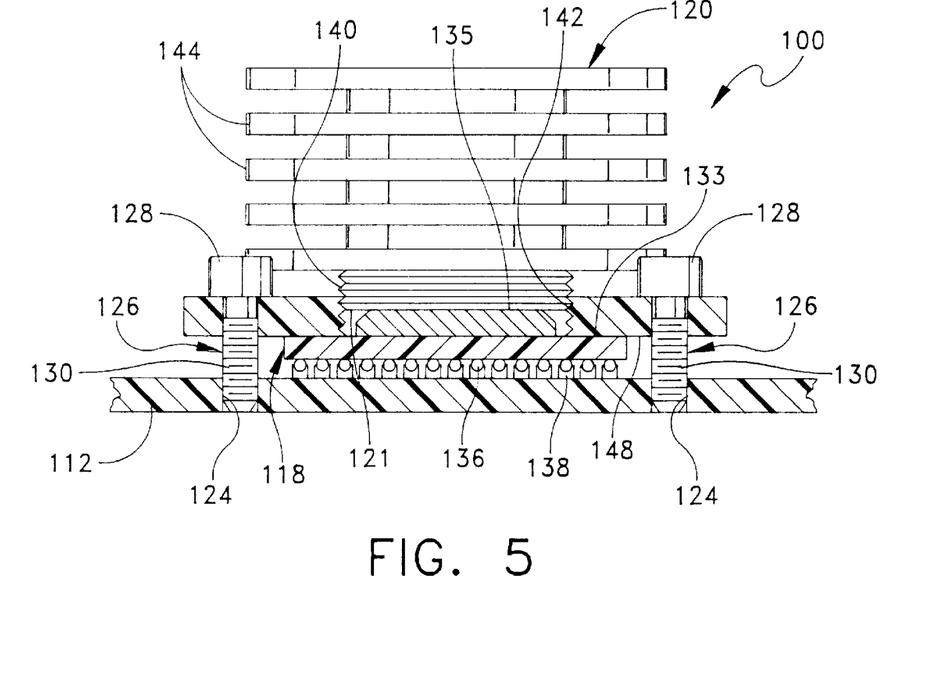
FIG. 5 is a cross-sectional view through the line 4—4 of FIG. 3 with heat dissipating member installed.

In FIGS. 2 and 3, the sandwiching of BGA device 118 between top cover plate 146 is shown. In FIGS. 3–5, the assembly and installation of the preferred embodiment of the heat sink assembly 100 of the present invention is illustrated. FIG. 3 illustrates a perspective view of the heat sink assembly 100 prior to installation of eat dissipating member 120. Further, FIG. 4 illustrates a cross-sectional view through line 4—4 of FIG. 3 prior to the installation of heat dissipating member 120. Referring now to both FIGS. 3 and 4, top cover plate 146 is screwed down and held in place by male thread fasteners 126, via threads 130 in threaded bore 124, onto the top surface 133 of ceramic portion 132 of BGA device package 118. Top cover plate 146 is secured and screwed down onto top surface 133 so that bottom surface 148 of top cover plate 146 applies the desired pressure to BGA device 118 so that ball contacts 136 adequately form an electrical interconnection with contacts 138. Fastener head 128 may be manipulated to threadably adjust the tension of top cover plate 146 onto ceramic portion 132.

Once top cover plate 146 is secured in place at the desired pressure, heat dissipating member 120 can now be installed independently at a different pressure. As seen in FIG. 4, female threaded aperture 142 is sufficiently large to permit BGA device 118 to reside completely therein. Male threaded base 140 is threadably inserted into female threaded aperture 142 so that bottom surface 121 of heat sink member 120 engages with top surface 135 of silicon portion 134 in complete flush thermal communication therewith. As shown in FIG. 5, heat dissipating member 120 is threadably installed to a desired tension and pressure. As discussed above, this pressure is preferably less than to the ceramic portion 132 because silicon portion 134 is much less tolerant to pressure and more easily damaged. In that connection, the pressure applied to the silicon portion 134 can be easily adjusted by threadably turning heat dissipating member 120 to the desired tension. As a result, pressure to the ceramic 132 of BGA device 118 can be independently set from the pressure applied to the silicon portion 134 of BGA device 118.

Figure 6:
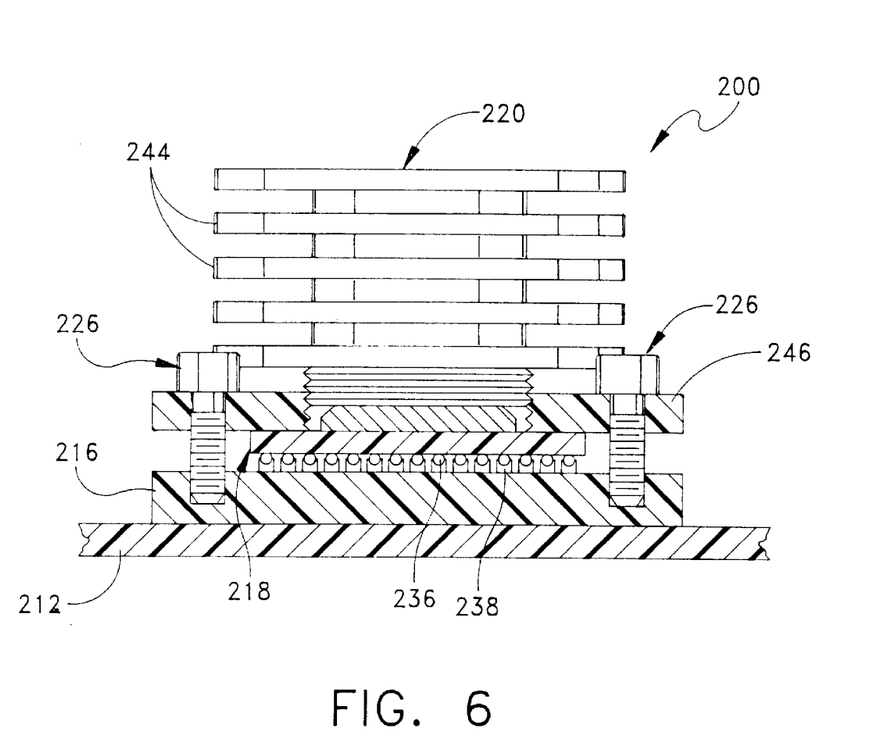
FIG. 6 is a cross-sectional view of a first alternative embodiment of the present invention with fasteners engaged with a socket installed on a circuit board.

Referring now to FIG. 6, a first alternative embodiment of the preferred embodiment of FIGS. 2–5 is shown. The first alternative embodiment 200 of FIG. 6 is essentially identical to the preferred embodiment but male threaded fasteners 226 threadably engage directly with BGA socket 216 which resides on circuit board 212. The first alternative embodiment 200 illustrates the flexibility of the assembly of the present invention where the particular configuration of the socket and circuit board is of little consequence as long as BGA device 218 is sandwiched between contact array 238 and top cover plate 246 with BGA balls 236 in communication with contacts 238.

Figure 7:
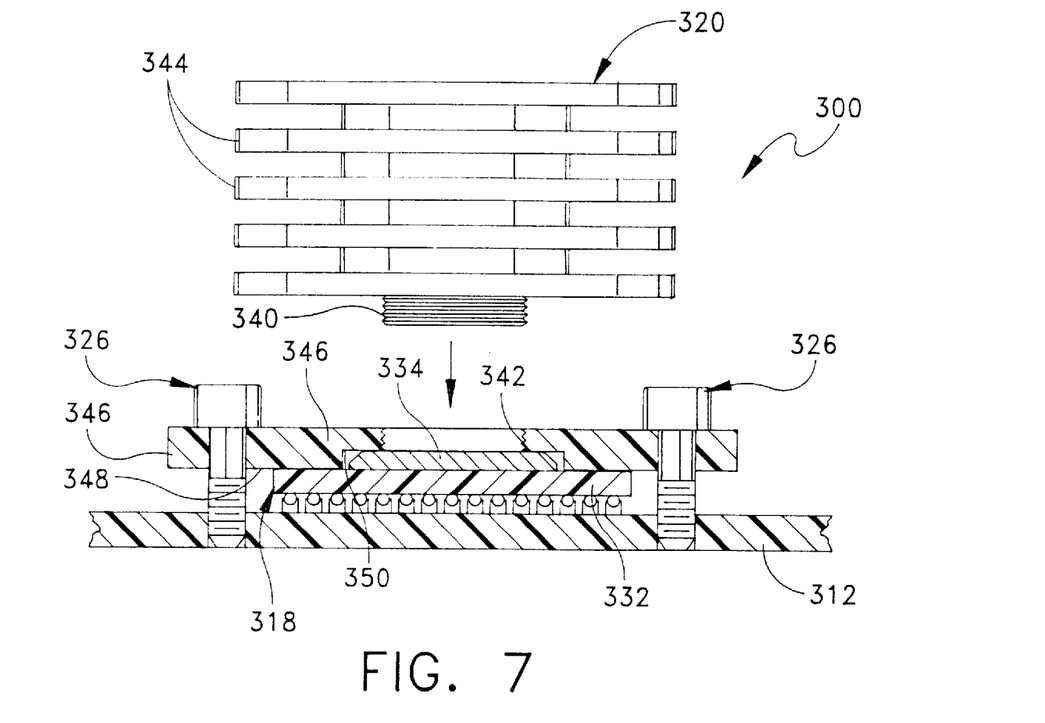
FIG. 7 is cross-sectional view of a second alternative embodiment of the present invention prior to installation of a heat dissipating member.
Figure 8:
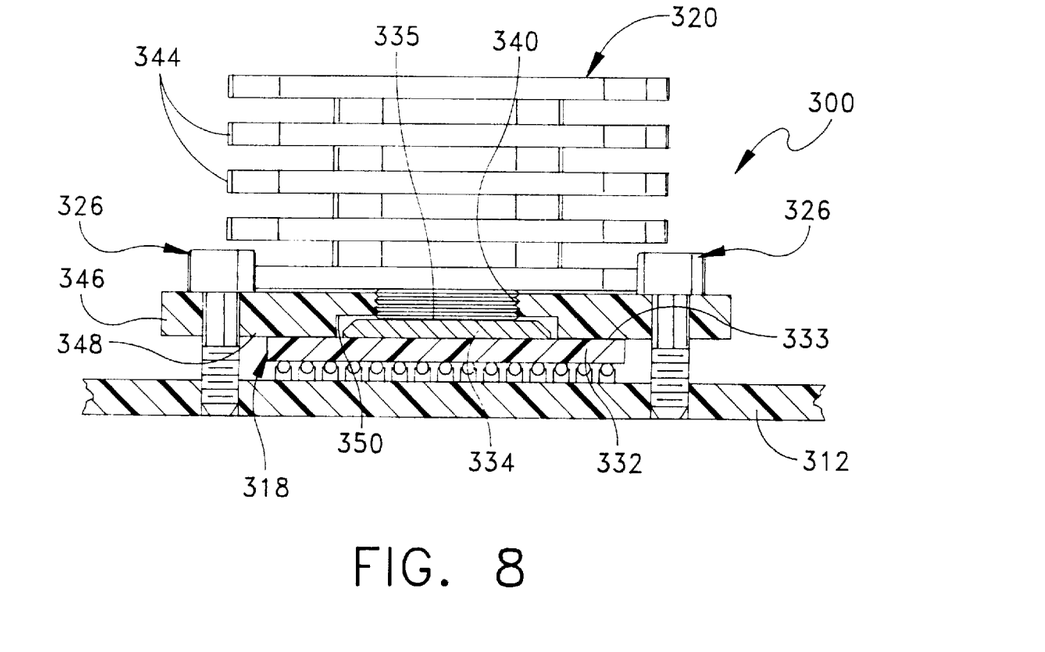
FIG. 8 is a cross-sectional view of the second alternative embodiment of FIG. 7 with heat dissipating member fully installed.

Still further, a second alternative embodiment is shown in FIGS. 7 and 8. This second alternative embodiment 300 includes heat dissipating member 320 with radiating fins 344 and male threaded shank 340 which threadably engages with female threaded aperture 342. In contrast to the preferred embodiment and the first alternative embodiment, this second alternative embodiment 300 provides a seat 350 under the bottom surface of top cover plate 346 to receive and protect silicon portion 334 of BGA device 318. FIGS. 7 and 8 illustrate the multiple pressure capability of the present invention with the further employment of a thicker top cover plate 346 to further enable the use of a stronger top cover plate, for example. This second alternative embodiment 300 further illustrates the flexibility of the assembly of the present invention to accommodate a wide range of semiconductor device packages and different socket configurations.

It is preferred that the top cover plates 146, 246 and 346 be manufactured of plastic material, such as a high temperature resistant and high creep resistant plastic for better withstanding the high temperatures associated with microprocessors. For example, the plastic material for top cover plates 146, 246 and 346 may be LNP VERTON UF-700-10-HS (P.P.A. 50% long fiber) for use in high temperate heat sink applications. In addition, heat dissipating members 120, 220 and 320 are preferably metal, such as aluminum, for optimum thermal transfer and dissipation of heat from semiconductor device packages 118, 218 and 318. As shown in FIGS. 2–8, radial fins 144, 244 and 344 are provided but various other heat sink fin configurations, such as a pin grid array, may be employed.

It should be understood that various types of threads are envisioned within the scope of the present invention. These various thread designs include continuous threads about the base of a heat dissipating member which have many turns. It is preferred that there be at least more than one turn to facilitate the adjustment of pressure to the silicon portion of the BGA device. However, a single turn 360° thread, as well as half and quarter turn thread are considered to be within the scope of the present invention due to the ability to impart any desired pressure to the silicon portion of the BGA device from the rotation of the heat dissipating member. Further, bayonet-type bases of the heat dissipating member which engage with ramped notches within the bore through the top cover plate are also considered to be threads which can provide a gradual, hand-controllable pressure to the silicon portion of the BGA device package.

The present invention illustrates two levels of pressure, one provided by the top cover plate and the second provided by the threadable engagement of the heat dissipating member into the female-threaded bore. Third and fourth pressures may also be applied to accommodate the specific needs of a wide array of types of semiconductor device packages. Additional top cover plates may be provided along with additional threaded heat dissipating members to accommodate such device packages.

It would be appreciated by those skilled in the art that various changes and modifications can be made to the illustrated embodiments without departing from the spirit of the present invention. All such modifications and changes are intended to be covered by the appended claims.

What is claimed is:

1. A heat dissipating device for removing heat from an electronic device package, comprising:

a semiconductor socket; said socket defining a plurality of female-threaded fastener holes;

a semiconductor package installed on said socket; said semiconductor package having a lower surface with electrical contacts thereon; said electrical contacts being in electrical communication with said semiconductor socket; said semiconductor package including an outer peripheral region defining a first thickness of said semiconductor package and a first upper surface and an inner pad region defining a second thickness of said semiconductor package, which is larger than said first thickness, and a second upper surface;

a top cover member with a peripheral edge and a bottom surface; said top cover member defining a female threaded bore therethrough; said bottom surface of said top cover member being in communication with said first upper surface of said semiconductor package at said outer peripheral region; said top cover member including a plurality of fastener through-holes therethrough proximal to said peripheral edge;

a heat dissipating member having a threaded base portion with a substantially flat bottom surface adapted to be threadably received in said female threaded bore through said top cover member so that said flat bottom surface of said heat dissipating member is in flush thermal communication with said second upper surface of said semiconductor package at said inner pad region; threaded communication of said heat dissipating member and said threaded bore defining an inner pad region pressure onto said second upper surface of said semiconductor package;

a plurality of male-threaded fasteners routed through said fastener through-holes of said top cover member and into communication with said female-threaded fastener holes of said semiconductor socket thereby maintaining communication of said bottom surface of said top cover member with said first upper surface of said semiconductor package; said fasteners defining an outer peripheral region pressure to be imparted on said first upper surface of said semiconductor package by said bottom surface of said top cover member;

whereby said outer peripheral region pressure and said inner pad region pressure are independently adjustable to enable different pressures to be applied to said first upper surface of said semiconductor package and said second upper surface of said semiconductor package, respectively.

2. The heat dissipating device of claim 1, wherein said inner pad region pressure applied to said first upper surface of said semiconductor package is less than said outer peripheral region pressure applied to said second upper surface of said semiconductor package.

3. The heat dissipating device of claim 1, further comprising:

a circuit board; said semiconductor socket being installed on said circuit board.

4. The heat dissipating device of claim 1, wherein said heat dissipating member includes a plurality of fin members.

5. The heat dissipating device of claim 1, wherein said top cover member is made of plastic.

6. The heat dissipating device of claim 1, further comprising:

a seat extending upwardly from said bottom surface of said top cover member a distance at least as much as said second thickness of said semiconductor package to accommodate said inner pad region of said semiconductor package therein.

7. A heat dissipating device for removing heat from an electronic device package, comprising:

a semiconductor socket;

a semiconductor package installed said socket; said semiconductor package having a lower surface with electrical contacts thereon; said electrical contacts being in electrical communication with said semiconductor socket; said semiconductor package including an outer peripheral region defining a first thickness of said semiconductor package and a first upper surface and an inner pad region defining a second thickness of said semiconductor package, which is larger than said first thickness, and a second upper surface;

a top cover member with a peripheral edge and a bottom surface; said top cover member defining a female threaded bore therethrough; said bottom surface of said top cover member being in communication with said first upper surface of said semiconductor package at said outer peripheral region;

a heat dissipating member having a threaded base portion with a substantially flat bottom surface adapted to be threadably received in said female threaded bore through said top cover member so that said flat bottom surface of said heat dissipating member is in flush thermal communication with said second upper surface of said semiconductor package at said inner pad region; threaded communication of said heat dissipating member and said threaded bore defining an inner pad region pressure onto said second upper surface of said semiconductor package;

fastening means for maintaining communication of said bottom surface of said top cover member with said first upper surface of said semiconductor package; said fastening means defining an outer peripheral region pressure to be imparted on said first upper surface of said semiconductor package by said bottom surface of said top cover member;

whereby said outer peripheral region pressure and said inner pad region pressure are independently adjustable to enable different pressures to be applied to said first upper surface of said semiconductor package and said second upper surface of said semiconductor package, respectively.

8. The heat dissipating device of claim 7, wherein said inner pad region pressure applied to said first upper surface of said semiconductor package is less than said outer peripheral region pressure applied to said second upper surface of said semiconductor package.

9. The heat dissipating device of claim 7, further comprising:

a circuit board; said semiconductor socket being installed on said circuit board.

10. The heat dissipating device of claim 7, wherein said heat dissipating member includes a plurality of fin members.

11. The heat dissipating device of claim 7, wherein said top cover member is made of plastic.

12. The heat dissipating device of claim 7, further comprising:

a seat extending upwardly from said bottom surface of said top cover member a distance at least as much as said second thickness of said semiconductor package to accommodate said inner pad region of said semiconductor package therein.

13. The heat dissipating device of claim 7, wherein said fastening means is a plurality of male-threaded fasteners routed through a plurality of corresponding fastener through-holes is said top cover member and into communication with a plurality of corresponding female-threaded fastener holes in said semiconductor socket.

14. The heat dissipating device of claim 9, wherein said fastening means is a plurality of male-threaded fasteners routed through a plurality of corresponding fastener through-holes is said top cover member and into communication with a plurality of corresponding female-threaded fastener holes in said circuit board.

* * * * *